United States Patent
Ting et al.

(10) Patent No.: US 6,779,014 B1
(45) Date of Patent: Aug. 17, 2004

(54) CYCLIC STEP BY STEP DECODING METHOD USED IN DISCRETE FOURIER TRANSFORM CYCLIC CODE OF A COMMUNICATION SYSTEM

(75) Inventors: Yeun-Renn Ting, Taoyuan (TW); Erl-Huei Lu, Taoyuan (TW); Pi-Chang Ko, Taipei (TW); Hsien-Yu Chu, Taoyuan (TW)

(73) Assignee: Chung-Shan Institute of Science & Technology, Taoyuan (TW)

( * ) Notice: Subject to any disclaimer, the term of this patent is extended or adjusted under 35 U.S.C. 154(b) by 363 days.

(21) Appl. No.: 09/783,545

(22) Filed: Feb. 15, 2001

(51) Int. Cl.[7] .......................... G06F 11/00; G06F 15/00
(52) U.S. Cl. ................ 708/530; 708/405; 708/492
(58) Field of Search ............... 708/403, 622, 708/492, 530–534, 421, 405; 375/231; 714/784, 752

(56) References Cited

U.S. PATENT DOCUMENTS 5,293,401 A * 3/1994 Serfaty ...................... 708/323
5,774,389 A * 6/1998 Iwamura ..................... 708/492
5,948,117 A * 9/1999 Weng et al. ................ 714/784

OTHER PUBLICATIONS

Michael et al., A comparison of binary Quasi–Cyclic decoder implementations, 2000, IEEE, pp. 280–286.*

* cited by examiner

Primary Examiner—Kakali Chaki
Assistant Examiner—Chat Do
(74) Attorney, Agent, or Firm—Bacon & Thomas, PLLC

(57) ABSTRACT

Discrete Fourier transformation is applied to an analog system so that a signal be transfering, the analog data can be corrected before being quantized and after being transferred and received. In the DFT cyclic decoder and the method of the same, a cyclic property of DFT code is used to induce a decoding way in the receiving end of a communication system. This way is used to design a basic decoding circuit and a fast decoding circuit structure. Since the decoding process is quick and the structure is simple so that the analog error correcting code is used widely.

24 Claims, 4 Drawing Sheets

CYCLIC STEP BY STEP DECODING METHOD USED IN DISCRETE FOURIER TRANSFORM CYCLIC CODE OF A COMMUNICATION SYSTEM

FIELD OF THE INVENTION

The present invention relates to decoding of a communication system, and especially to cyclic step by step decoding method used in discrete Fourier transform cyclic code of a communication system.

BACKGROUND OF THE INVENTION

Error control coding is one of efficient techniques for error control in many digital systems. In particular, the class of Reed-Solomon codes (RS code) has been widely used in reliable communication systems and data storage systems. An (n, k) RS code is encoding and decoding by using the arithmetic of Galois fields GF($P^m$). Since the minimum distance of the code is n−k+1, it is called a maximum-distance-separable code (MDS code). Although the RS has many important advantages; for example, it has high error correcting capability and can simultaneously correct random errors and multiple burst errors. However its code length is constrained to be $p^m-1$ or a factor of $p^m-1$, and each byte in a code word should be m bits (if p=2), besides any error bit caused by a low noise will be counted as an error of the whole byte. Discrete Fourier Transforms are playing on increasing implement role in many practical applications. There are same branches for investigation of the discrete transform; for example, as indicated by Marshall [1], the using of error control coding for discrete signals, and by Lin and Shiu [2], using DCT in Real-valued error control coding. However, the Wu-Shiu's code has not cyclic structure such that it cannot be encoded and decoded by using a step-by-step manner.

SUMMARY OF THE INVENTION

In this invention, a (N, N−$d_{min}$+1) cyclic code is presented based on complex-valued discrete Fourier transform, the cyclic structure of the code makes the encoding and decoding procedures much easier than that of Marshall's and Wu-Shiu's codes. Since the code length N of the code can be any positive integer and each symbol in a code word is a complex value (consists of two real value), the code can be directly applied to analog communication systems and analog signal storage systems. Moreover, small amount of errors caused from low noise, computation truncating or rounding can be deleted by using a proper threshold for syndrome values. Finally, a (N, N−2) code is used as an example to illustrate the encoding and decoding procedures.

DESCRIPTION OF THE PREFERRED EMBODIMENT

Figure 1:
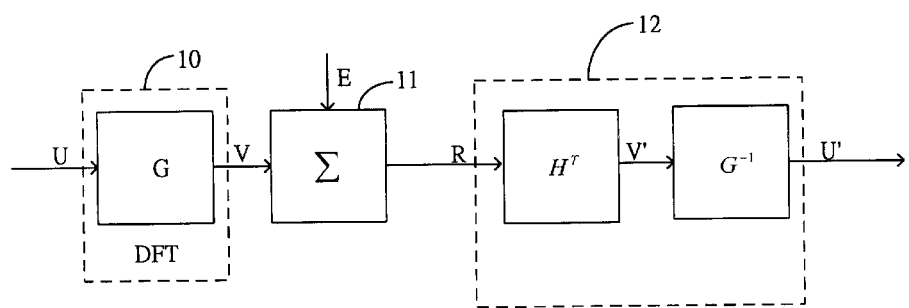
FIG. 1 is show the signal transferring construction of the present invention.

The Transmission structure of discrete signal can be simplified as FIG. 1. Then we expand the transmission of a discrete-time signal, i.e. a sequence of complex numbers $\{u_i\}$ by a complex-valued (n, k) block coding procedure involves the following step:

(i) The information vector U=$\{u_i\}$ is encoded into an N-tuple V, called a code vector, as shown by $$V = U \cdot G \tag{1}$$

Where G is a k·n matrix of rank k, call the generator matrix.

(ii) Let R be the received vector at the other end of the transmission channel and suppose that an unknown error E is introduced as $$R = V + E \tag{2}$$

Where we assume the channel noise to be random and additives, and the operation '+' is a traditional addition rather then a modular 2 addition. As is well known, for each k·n matrix G of rank k, there will be an (n−k)·n matrix H of ranks n−k such that G is in the null space of $H^T$, i.e. matrices G and H are related by $$G \cdot H^T = 0 \tag{3}$$

H is the parity check matrix of F the syndrome vector S of a received vector R is defined as $$S = R \cdot H^T$$

$$= (V+E) \cdot H^T$$

$$= V \cdot H^T + E \cdot H^T$$

$$= E \cdot H^T \tag{4}$$

If E=0, no error occurs, then $$S = R \cdot H^T = 0 \tag{5}$$

I.e. the syndrome vector of any code vector is 0.

(iii) After identify the syndromes of the received vector R, the decoder must determine the optimal estimate of E, say E'. According to the maximum-likelihood decoding rule, the optimal estimate E' is the error pattern, generated from the calculated syndromes, which has the fewest nonzero elements. Finally, the estimated V' and U' of the corresponding actual sequences are, respectively obtained by $$V' = R - E' \tag{6}$$

$$U' = V' \cdot G^{-1} \tag{7}$$

Where the matrix $G^{-1}$ is an n·k matrix right inverse of G, such that $$G \cdot G^{-1} = I_k \tag{8}$$

Basic Ideal of the Present Invention

Select generator matrix G is $$G = \begin{bmatrix} w^{00} & w^{01} & \ldots & w^{0(N-1)} \\ w^{10} & w^{11} & \ldots & w^{1(N-1)} \\ \vdots & \vdots & w^{kn} & \vdots \\ w^{(K-1)0} & w^{(K-1)1} & \ldots & w^{(K-1)(N-1)} \end{bmatrix} \tag{9}$$

-continued $$= \begin{bmatrix} 1 & 1 & \ldots & 1 \\ 1 & w^{11} & \ldots & w^{1(N-1)} \\ \vdots & \vdots & w^{kn} & \vdots \\ 1 & w^{(K-1)1} & \ldots & w^{(K-1)(N-1)} \end{bmatrix}$$

Since G is a k·n matrix of rank k. if G satisfies (3) and (5), then G will generate a (n, k) linear code.

Let the (N−K)·K matrix H consist of the remaining N−K rows, say K, K+1, ..., N−1, which are called parities, as its N−K rows, then we select H as $$H = \begin{bmatrix} w^{K(N-1)} & w^{K(N-2)} & \ldots & w^{K0} \\ w^{(K+1)(N+1)} & w^{(K+1)(N-2)} & \ldots & w^{(K+1)0} \\ \vdots & \vdots & w^{kn} & \vdots \\ w^{(N-1)(N-1)} & w^{(N-1)(N-2)} & \ldots & w^{(N-1)0} \end{bmatrix} \quad (10)$$

$$= \begin{bmatrix} w^{K(N-1)} & w^{K(N-2)} & \ldots & 1 \\ w^{(K+1)(N-1)} & w^{(K+1)(N-2)} & \ldots & 1 \\ \vdots & \vdots & w^{kn} & \vdots \\ w^{(N-1)(N-1)} & w^{(N-1)(N-2)} & \ldots & 1 \end{bmatrix}$$

1. Technical Consideration

Figure 2:
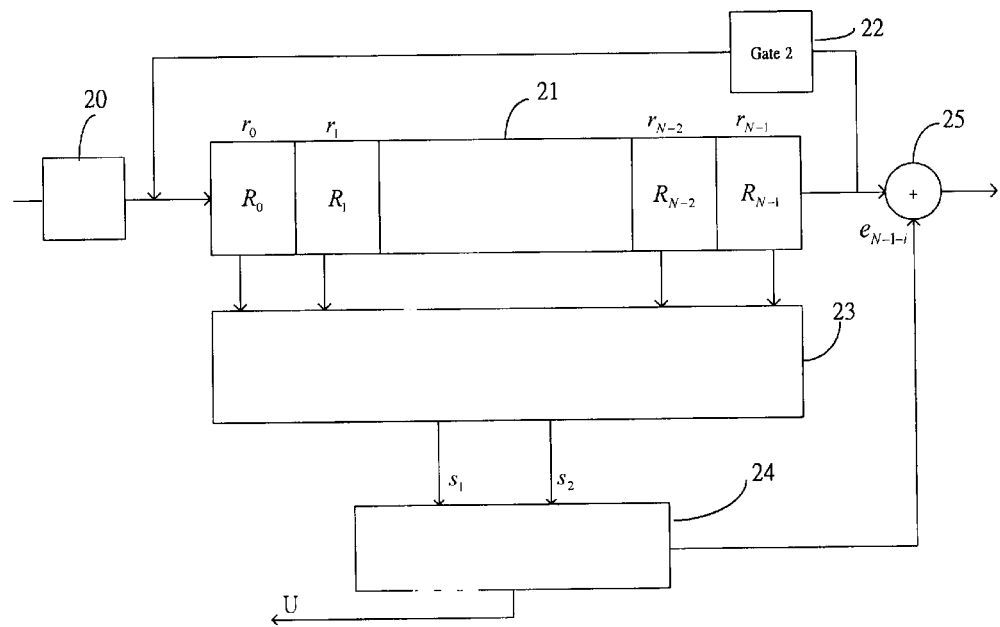
FIG. 2 shows the (N, N−2) DFT cyclic circuit for correcting the error of single symbol or double symbol.

For a (N, K) cyclic code, if the shortest distance between codewords is dmin=3, then an error symbol can be corrected. Now, consider that (N, N−2), k=N−2, N−K=2, therefor the number of syndrome is equal to 2. Therefore, from the view point of circulation, the decoder can be designed as FIG. 2.

Wherein the decoder has the following components:

A signal receiving gate 20 for receiving input signals;

N series connected buffer registers 21 connected in series, each buffer register serving for registering one symbol;

A shift control gate 22 connected between a first and a Nth buffer registers for right-round-shifting the symbol in each buffer register through one register;

A syndrome vector calculating unit 23 connected to an output of Nth buffer register in parallel for calculating a first and a second elements of the syndrome vector;

A processing unit 24 for comparing the syndrome elements in the syndrome vector; controlling operations of the signal receiving gate and the shift control gate; and A subtract 25 for performing an operation of subtraction to outputs of the buffer registers and the processing unit; and outputting the result;

The cyclic step by step decoding device performs the steps of receiving a discrete signal having N symbols; storing the discrete signal into N stage buffer registers; setting a number of i and an initial value of i being to 0; (i) if i is equal to N, it considers that the receiving signal is incorrect; and the process comes to an end; (ii) if i is unequal to N, then the process entering into the following step; calculating a first element and a second element of the syndrome vector according to the received symbols; determining whether the first element and second element of the syndrome vector are larger than a threshold; if both the first and second elements are smaller than the threshold, then it represent the error of N−1−i is 0; then all the symbols in the registers are outputted, which are decoded signals; the process the stop; if one of the first and second elements is larger than a threshold; subtracting the two elements, taking an absolute value of the result and comparing the absolute value to the threshold; if smaller than the threshold, then (N−1−i)th error being the first element of the syndrome vector; subtracted the error from the (N−1−i) symbol; then ouputting all the symbols in the registers, which are signals decoded; if larger than the threshold, then round-shifting the symbols in N registers to right with one a length of one register; and thus acquiring a new register series; the number i is added by one and returning the process to the step of calculating the syndrome vector and repeat the above process.

Let us consider three conditions as follow (i) If there is no error:

Error pattern=$[e_0 \; e_1 \; \ldots \; e_{N-1}]$, then $e_0 = e_1 = \ldots = e_{N-1} = 0$. So that syndrome $$s_1 = s_2 = 0$$

$$s_1^{(1)} = s_2^{(1)} = 0,$$

$$s_1^{(N-1)} = s_2^{(N-1)} = 0$$

Where $s_1^{(i)}$ is $s_1$ cyclic shift i times. We can verify there is no error.

(ii) If there is one error:

Error pattern=$[e_0 \; e_1 \; \ldots \; e_{N-1}]$, and the error location is at δ. So some one $$e_\delta = a+jb \text{ for } 0 \leq \delta \leq N-1$$

$$e_i = 0 \text{ for } i \neq \delta$$

When one block data received in register $R_0 \; R_1 \; \ldots \; R_{N-1}$, $$[s_1 \; s_2] = [r_0 \; r_1 \; \ldots \; r_{N-1}] \cdot \begin{bmatrix} w^{K(N-1)} & w^{(K+1)(N-1)} \\ w^{K(N-2)} & w^{(K+1)(N-2)} \\ \ldots & \ldots \\ w^{K1} & w^{(K+1)1} \\ 1 & 1 \end{bmatrix} \quad (11)$$

$$= [e_0 \; e_1 \; \ldots \; e_{N-1}] \cdot \begin{bmatrix} w^{K(N-1)} & w^{(K+1)(N-1)} \\ w^{K(N-2)} & w^{(K+1)(N-2)} \\ \ldots & \ldots \\ w^{K1} & w^{(K+1)1} \\ 1 & 1 \end{bmatrix}$$

$$s_1 = e_0 w^{K(N-1)} + e_1 w^{K(N-2)} + \ldots + e_{N-2} w^{K1} + e_{N-1} \quad (12)$$

$$s_2 = e_0 w^{(k+1)(N-1)} + e_1 w^{(k+1)(N-2)} + \ldots + e_{N-2} w^{(k+1)1} + e_{N-1} \quad (13)$$

We assume the error location is at position N−1, i.e. $e_{N-1} = a+jb$.

And $e_0 = e_1 = \ldots = e_{N-2} = 0$

Then $s_1 = e_{N-1} = a+jb$ $s_2 = e_{N-1} = a+jb$

So we can detect error location=N−1, error value=a+jb.

If error locate is not at position N−1, $$e_{N-1} = 0, \; e_\delta = a+jb, \; \delta \neq N-1, \text{ then}$$

$$s_1 = e_\delta w^{k\delta} = c+jd$$

$$s_2 = e_\delta w^{(k+1)\delta} = f+jg$$

$$\because w^{k\delta} \neq w^{(k+1)\delta} \therefore c+jd \neq f+jg$$

So we verify there are some errors, but not at position N−1.

When the register data cyclic shift δ times, then $$[s_1^{(\delta)}\ s_2^{(\delta)}] = \quad (14)$$

$$[e_\delta\ e_{\delta+1}\ \ldots\ e_{N-1}, e_0\ \ldots\ e_{\delta-1}] \cdot \begin{bmatrix} w^{K(N-1)} & w^{(K+1)(N-1)} \\ w^{K(N-2)} & w^{(K+1)(N-2)} \\ \ldots & \ldots \\ w^{K1} & w^{(K+1)1} \\ 1 & 1 \end{bmatrix}$$

We assume $e_\delta = a+jb$, $e_i = 0$, for $i \neq \delta$ and $0 \leq i \leq N-1$, then $$s_1^{(\delta)} = a+jb$$
$$s_2^{(\delta)} = a+jb$$

So we can verify the error location is δ, and error value is a+jb.

(iii) If there are more than one errors:

$$s_1^{(i)} = c+jd$$
$$s_2^{(i)} = f+jg$$

When we shift the register data right i times, i from 0 to N−1, can't get the same syndrome. So we verify there are more than one error and can't be correct.

Figure 3:
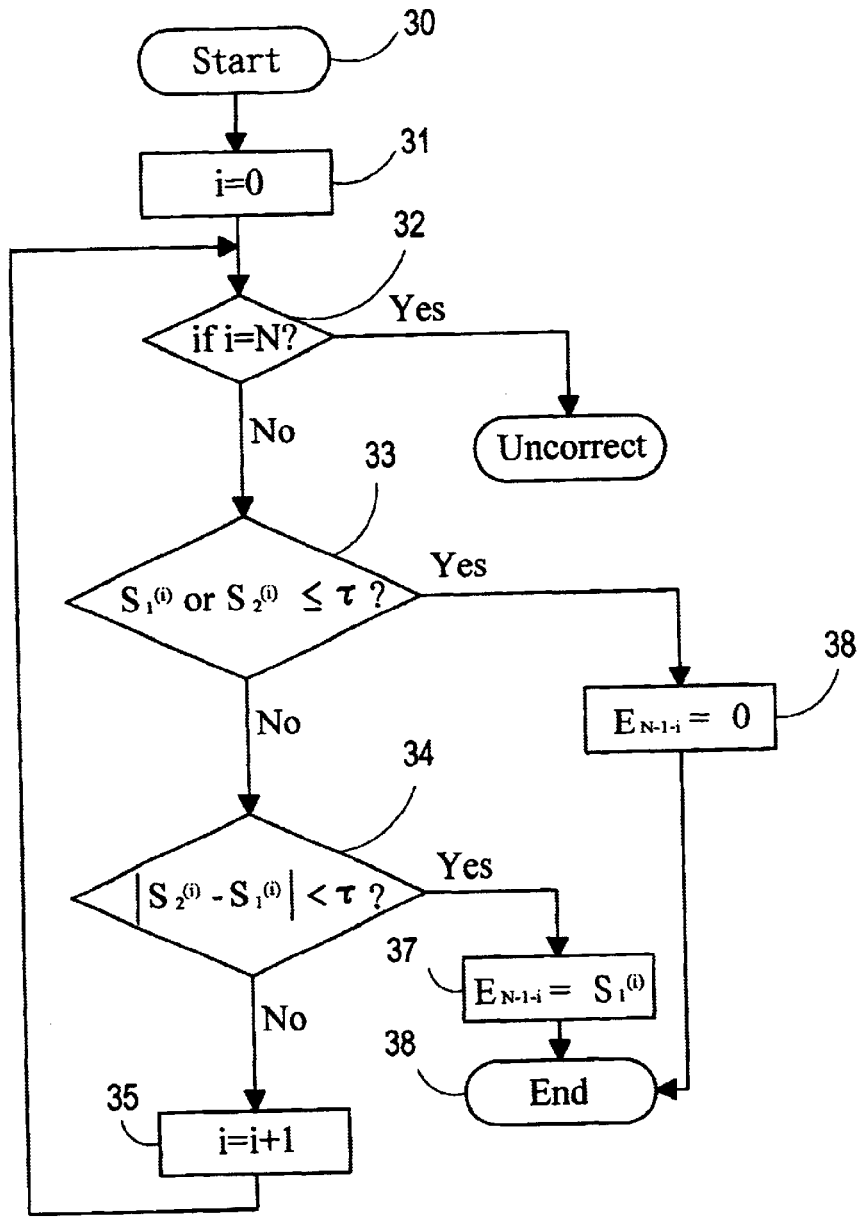
FIG. 3 shows the decoding process of the decoder in the present invention.

In summery, referring to FIG. 3, the DFT has a cyclic property, and thus the step-by-step decoding rule is that:
(a) If the syndrome equation s1=s2=0, then the receiving block is correct, and the decoding work is accomplished.
(b) If the syndrome equation s1=s2, but unequal to 0, then $e_{N-1-i} = s_1$, and others are correct, then the decoding process is complete.
(c) Otherwise $e_{N-1-i} = 0$ The decoding process is listed in the following:
(1) receiving a discrete signal having N symbols;
(2) storing the discrete signal into N stage buffer registers;
(3) setting a number of i and an initial value of i being to 0;
   (i) if i is equal to N, it considers that the receiving signal is incorrect; and the process comes to an end;
   (ii) if i is unequal to N, then the process entering into the following step;
(4) calculating a first element and a second element of the syndrome vector according to the received symbols;
(5) determining whether the first element and second element of the syndrome vector are larger than a threshold;
(6) if both the first and second elements are smaller than the threshold, then it represent the error of N−1−i is 0; then all the symbols in the registers are outputted, which are decoded signals; the process the stop;
(7) if one of the first and second elements is larger than a threshold; subtracting the two elements, taking an absolute value of the result and comparing the absolute value to the threshold;
   (i) if smaller than the threshold, then (N−1−i)th error being the first element of the syndrome vector; the (N−1−i) symbol being added with the error; then ouputting all the symbols in the registers, which are signals decoded;
   (ii) if larger than the threshold, then round-shifting the symbols in N registers to right with one a length of one register; and thus acquiring a new register series;
(8) the number i is added by one and returning the process to step (3).

2. A Fast Decoding Algorithm for (N, N−2) DFT Cyclic Codes

From (21)

$$s_1 = e_0 w^{k(N-1)} + e_1 w^{k(N-2)} + \ldots + e_{N-2} w^{k1} + e_{N-1}$$

$$= e_0 w^{-k} + e_1 w^{-k2} + \ldots + e_{N-1} w^{-k(N-2)} + e_{N-1} w^{-kN}$$

$$= w^{-k} \cdot [e_0 + e_1 w^{-k1} + \ldots + e_{N-1} w^{-k(N-1)}] \quad (15)$$

From (22)

$$s_2 = e_0 w^{(k+1)(N-1)} + e_1 w^{(k+1)(N-2)} + \ldots + e_{N-2} w^{(k+1)1} + e_{N-1}$$

$$= e_0 w^{-(k+1)} + e_1 w^{-(k+1)2} + \ldots + e_{N-1} w^{-(k+1)(N-2)} + e_{N-1} w^{-(k+1)N}$$

$$= w^{-(k+1)} \cdot [e_0 + e_1 w^{-(k+1)1} + \ldots + e_{N-1} w^{-(k+1)(N-1)}] \quad (16)$$

From (23)

$$s_1^{(1)} = e_{N-1} w^{k(N-1)} + e_0 w^{k(N-2)} + \ldots + e_{N-2} w^{k(N-1)}$$

$$= w^{-k} \cdot [e_0 w^{k(N-1)} + \ldots + e_{N-2} w^{k(N-1)} + e_{N-1} w^{kN}]$$

$$= w^{-k} \cdot s_1 \quad (17)$$

$$s_2^{(1)} = e_{N-1} w^{(k+1)(N-1)} + e_0 w^{(k+1)(N+2)} + \ldots + e_{N-2} w^{(k+1)(N-1)}$$

$$= w^{-(k+1)} \cdot [e_0 w^{(k+1)(N-1)} + \ldots + e_{N-2} w^{(k+1)(N-1)} + e_{N-1} w^{(k+1)N}]$$

$$= w^{-(k+1)} \cdot s_2 \quad (18)$$

So that the general cases are $$s_1^{(i+1)} = w^{-k} \cdot s_1^i \quad (19)$$

$$s_2^{(i+1)} = w^{-(k+1)} \cdot s_2^i \quad (20)$$

Figure 4:
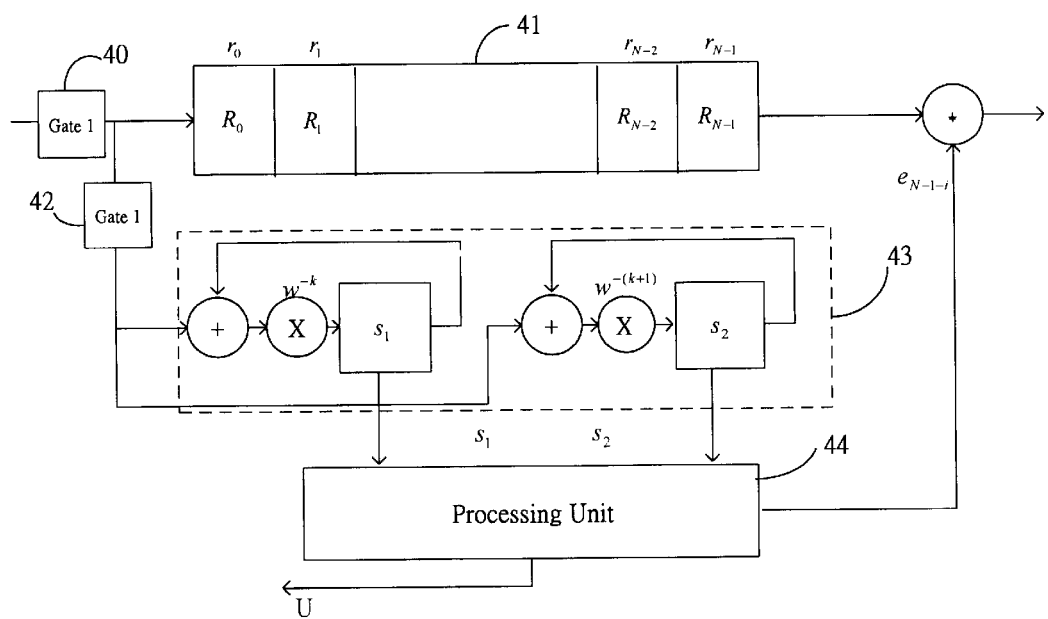
FIG. 4 is a fast decoding circuit of a (N, N−2) DFT according to the present invention.

A circuit can be designed according to this algorithm, as shown in FIG. 4, the circuit includes the following components:

A signal receiving gate 40 for receiving input signals;

N series connected buffer registers 41 connected in series, each buffer register serving for registering one symbol;

A syndrome vector calculating unit 42 connected to an output of Nth buffer register in series for calculating a first and a second elements of the syndrome vector;

A control gate 43 serially connected between the first buffer register and the signal receiving gate for controlling signals from the receiving gate to the syndrome vector calculation unit;

A processing unit 44 for comparing the syndrome elements in the syndrome vector; controlling operations of the signal receiving gate and the shift control gate; and A subtractor 45 for performing an operation of subtraction to outputs of the buffer registers and the processing unit; and outputting the result;

The cyclic step by step decoding device performs the steps of receiving a discrete signal having N symbols; storing the discrete signal into N stage buffer registers; setting a number of i and an initial value of i being to 0; (i) if i is equal to N, it considers that the receiving signal is incorrect; and the process comes to an end; (ii) if i is unequal to N, then the process entering into the following step; calculating a first element and a second element of the syndrome vector according to the received symbols; determining whether the first element and second element of the syndrome vector are larger than a threshold; if both the first and second elements are smaller than the threshold, then it represent the error of N−1−i is 0; then all the symbols in the registers are outputted, which are decoded signals; the process the stop; if one of the first and second elements is larger than a threshold; subtracting the two elements, taking an absolute value of the result and comparing the absolute value to the threshold; if smaller than the threshold, then (N−1−i)th error being the first element of the syndrome vector; subtracted the error from the (N−1−i) symbol; then ouputting all the symbols in the registers, which are signals decoded; if larger than the threshold, then round-shifting the symbols in N registers to right with one a length of one register; and thus acquiring a new register series; the number i is added by one and returning the process to the step of calculating the syndrome vector and repeat the above process.

Figure 5:
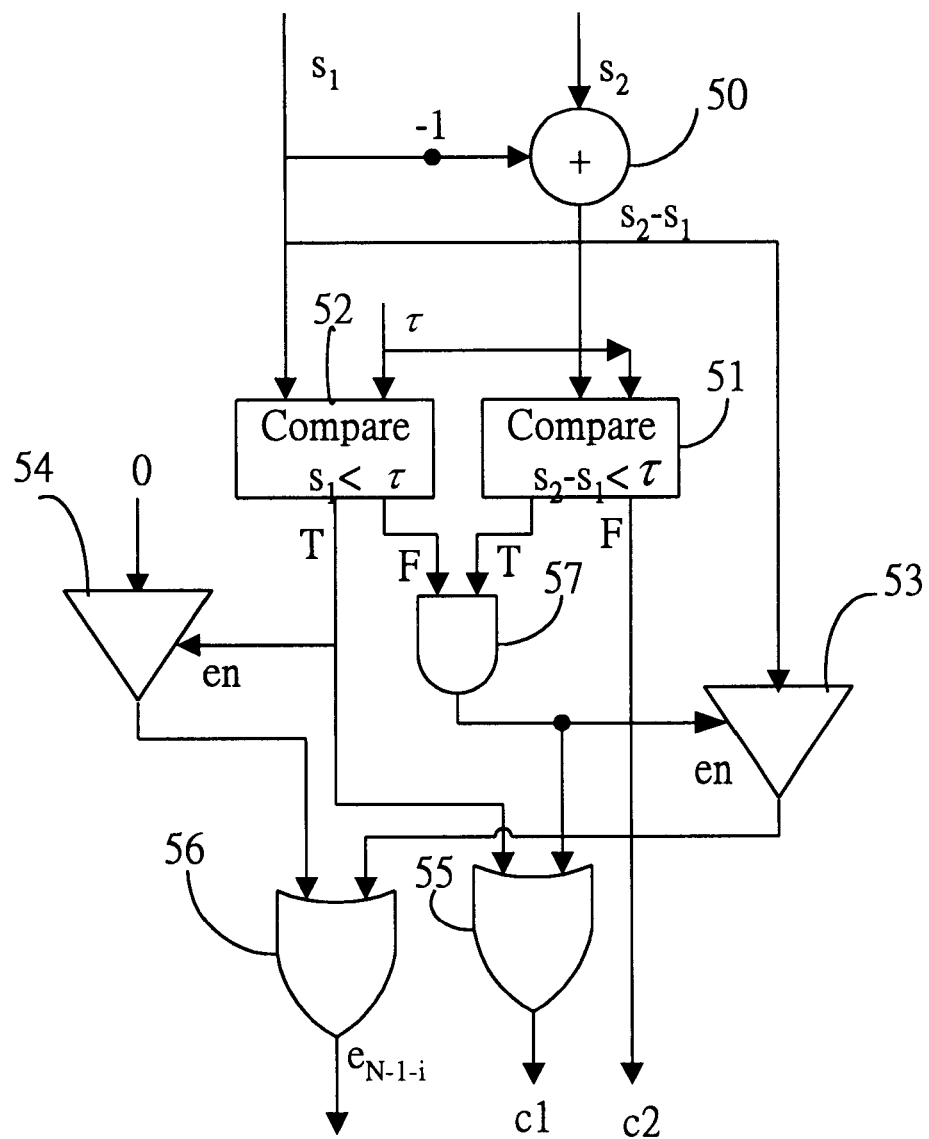
FIG. 5 shows a circuit of the processing unit in the present invention.

In the present invention, when the symbol has only one word, as shown in FIG. 5, the circuit structure is constructed by the following component:

A subtractor 50 with an input of the first and second elements of the syndrome vector for performing a subtracting opertion;

A first comparator 51 with an input from an output of the subtrator and a threshold;

A second comparator 52 with an input of first element of the syndrome vector and a threshold;

An AND gate 57 having an input end connected to the outputs of the first and second comparators;

A first gate 53 enabled by an output of the AND gate and having an input end connected to the first element of the syndrome vector;

A second gate 54 enabled by an output of the second comparator and having an input of 0;

A first OR gate 55 connected to an output of the second comparator and an output of the AND gate; and A second OR gate 56 connected to outputs of the first and second amplifiers.

3. Conclusion

In the present invention, we have introduced a new class of complex-valued cyclic codes and have shown that a subclass of them has a similar structure to the Reed-Solomon code defined over finite field. The BCH bound on code capacity and conventional BCH decoding algorithms can be applied to this new subclass. And we also proof this subclass code is a cyclic code. This result supports the well-known concept that the RS code should be a subclass of a cyclic code. There exist a RS-like subclass cyclic code in frequency domain too. These results are derived using transform domain techniques. Furthermore we demonstrated how standard signal processing techniques could be applied to derive new decoding algorithms for cyclic error correcting codes.

4. References

[1] T. G. Marshall, Jr.: 'Coding of real-number sequences for error correction: a digital processing problem', IEEE Journal on Selected Areas in Communications, 1984, SAC-2 (2), pp. 381–391

[2] Ja-Ling Wu, Jiun Shiu: 'Real-valued error control coding by using DCT', IEE proceeding-I vol. 139, No 2, April 1992, pp. 133–139

[3] R. E. Blahut: 'Theory and practice of error control codes'. Addision-Wesley, New York, 1983

[4] Valdemar C. Da Rocha, Jr.: 'Maximum Distance Separable Multilevel Codes', IEEE Transactions On Information Theory, Vol. IT-30 No. 3, May 1984

[5] W. W. Peterson and E. J. Weldon, Jr., 'Error-Correcting Codes, $2^{nd}$ ed. Cambridge, Mass.: MIT, 1972

[6] Alan V. Oppenheim, Ronald W. Schafer: 'Discrete-Time Signal Process'. $2^{nd}$ ed. Prentice Hall 1999, pp.542–546

[7] F. J. MacWilliams, N. J. A. Sloane: 'The Theory of Error-Correcting Codes'. $1^{st}$ edition. $10^{th}$ impression. North-holland 1998

[8] Shu Lin/Daniel J. Costello, Tr. 'Error Control Coding: Fundmentals and Applications' Prentice-Hall Inc, 1983

5. Appendix (A) (8, 6) code. Input error e3= 0.50−j3.2
```
<< Input Data >>
X[0]:1.000000    X[1]:1.000000         X[2]:1.000000         X[3]:1.000000
X[4]:0.000000    X[5]:0.000000
<< After Encoder Data >>
[0]:4.000000     j0.000000       [1]:1.000001     j−2.414214    [2]:−0.000001
j−0.000001       [3]:1.000000    j−0.414213
[4]:0.000000     j−0.000001      [5]:0.999999     j0.414215     [6]:0.000002
j−0.000002       [7]:0.999994    j2.414212
<< Syndrome Data >>
s1:0.000012      j−0.000004      s2:0.000022      j−0.000001
<< After add noise Data >>
[0]:4.000000     j0.000000       [1]:1.000001     j−2.414214    [2]:−0.000001
j−0.000001       [3]:1.500000    j−3.614213
[4]:0.000000     j−0.000001      [5]:0.999999     j0.414215     [6]:0.000002
j−0.000002       [7]:0.999994    j2.414212
<< shift 0 Syndrome, Check 7 Symbol >>
s1:0.500024      j−3.200003      s2:−0.499993     j3.199996
<< shift 1 Syndrome, Check 6 Symbol >>
s1:−3.199995     j−0.500002      s2:1.909185      j2.616307
<< shift 2 Syndrome, Check 5 Symbol >>
s1:−0.499999     j3.199996       s2:3.200007      j0.500008
<< shift 3 Syndrome, Check 4 Symbol >>
s1:3.200004      j0.499999       s2:2.616307      j−1.909181
<< shift 4 Syndrome, Check 3 Symbol >>
s1:0.499996      j−3.200005      s2:0.500010      j=3.200004
<< shift 5 Syndrome, Check 2 Symbol >>
s1:−3.199993     j−0.500021      s2:−1.909154     j−2.616316
<< shift 6 Syndrome, Check 1 Symbol >>
s1:−0.500018     j3.199994       s2:−3.199991     j−0.500035
<< shift 7 Syndrome, Check 0 Symbol >>
s1:3.200002      j0.499996       s2:−2.616290     j1.909151
<< After Decoder Data >>
Detect:1 ==> There is One error, can be correct
Item=3   ErrValue: 0.500010  j−3.200004
```

-continued

| | | | | | |
|---|---|---|---|---|---|
| [0]:4.000000 | j0.000000 | [1]:1.000001 | j-2.414214 | [2]:-0.000001 | |
| j-0.000001 | [3]:0.999991 | j-0.414209 | | | |
| [4]:0.000000 | j-0.000001 | [5]:0.999999 | j0.414215 | [6]:0.000002 | |
| j-0.000002 | [7]:0.999994 | j2.414212 | | | |

<< After IDFKT Data >>

| | | | | |
|---|---|---|---|---|
| [0]:0.999998 | j0.000000 | [1]:1.000000 | j-0.000001 | [2]:1.000000 |
| j0.000001 | [3]:0.999998 | j-0.000000 | | |
| [4]:0.000001 | j.0.000000 | [5]:-0.000001 | j0.000002 | |

(B) (8, 6) code. Input more than one error, e1=1.0+j0.4 and e3 = 0.50−j3.2

<< Input Data >>

X[0]:1.000000   X[1]:1.000000   X[2]:1.000000  X[3]:1.000000
X[4]:0.000000   X[5]:0.000000

<< After Encoder Data >>

| | | | | |
|---|---|---|---|---|
| [0]:4.000000 | j0.000000 | [1]:1.000001 | j-2.414214 | [2]:-0.000001 |
| j-0.000001 | [3]:1.000000 | j-0.414213 | | |
| [4]:0.000000 | j-0.000001 | [5]:0.999999 | j0.414215 | [6]:0.000002 |
| j-0.000002 | [7]:0.999994 | j2.414212 | | |

<< Syndrome Data >> s1:0.000012    j-0.000004    s2:0.000022    j-0.000001

<< After add noise Data >>

| | | | | |
|---|---|---|---|---|
| [0]:4.000000 | j0.000000 | [1]:2.000001 | j-2.014214 | [2]:-0.000001 |
| j-0.000001 | [3]:1.500000 | j-3.614213 | | |
| [4]:0.000000 | j-0.000001 | [5]:0.999999 | j0.414215 | [6]:0.000002 |
| j-0.000002 | [7]:0.999994 | j2.414212 | | |

<< shift 0 Syndrome, Check 7 Symbol >>
s1:-0.499973    j-3.600008    s2:-0.099986    j2.199999
<< shift 1 Syndrome, Check 6 Symbol >>
s1:-3.600000    j0.499996    s2:1.484926    j1.626356
<< shift 2 Syndrome, Check 5 Symbol >>
s1:0.499999    j3.600000    s2:2.200009    j0.100003
<< shift 3 Syndrome, Check 4 Symbol >>
s1:3.600007    j-0.500000    s2:1.626356    j-1.484921
<< shift 4 Syndrome, Check 3 Symbol >>
s1:-0.500003    j-3.600006    s2:0.100007    j-2.200005
<< shift 5 Syndrome, Check 2 Symbol >>
s1:-3.599994    j0.499978    s2:-1.484891    j-1.626366
<< shift 6 Syndrome, Check 1 Symbol >>
s1:0.499982    j3.599994    s2:-2.199991    j-0.100035
<< shift 7 Syndrome, Check 0 Symbol >>
s1:3.600009    j-0.500001    s2:-1.626337    j1.484895
<< After Decoder Data >>
Detect:2 ==> There are more than One error, can not be correct

We claim:

1. A cyclic step by step decoding method used in a discrete Fourier transform cyclic code of a communication system, wherein in the transmitting terminal, signals are encoded by DFT (discrete Fourier transform) and then are emitted; a receiving system then receives discrete signals each having N symbols, and the N symbol discrete signal is decoded for removing errors and acquiring the original emitting signals, comprising the steps of:

(1) receiving a discrete signal having N symbols;
(2) storing the discrete signal into N stage buffer registers;
(3) setting a number of i and an initial value of i to 0 such that:
   (i) if i is equal to N, the receiving signal is incorrect; and the cyclic step by step decoding method comes to an end;
   (ii) if i is unequal to N, then the cyclic step by step decoding method enters into the next step:
(4) calculating a first element and a second element of a syndrome vector according to the received symbols;
(5) determining whether the first element and second element of the syndrome vector are larger than a threshold;
(6) if both the first and second elements are smaller than the threshold, representing the error of N−1−i as 0; and then outputting all the symbols in the registers, which are decoded signals; the cyclic step by step decoding method coming to an end;
(7) if one of the first and second elements is larger than the threshold; subtracting the two elements, taking an absolute value of the result from the subtracting operation and comparing the absolute value to the threshold;
   (i) if the absolute value is smaller than the threshold, taking the (N−1−i)th error as the first element of the syndrome vector; subtracting the error from the (N−1−i) symbol; and then outputting all the symbols in the registers, which are decoded signals;
   (ii) if the absolute value is larger than the threshold, then round-shifting the symbols in N registers to right by one length of one register; and thus acquiring a new register series;
(8) adding one to the number i and returning the cyclic step by step decoding method to step (3).

2. The cyclic step by step decoding method used in a discrete Fourier transform cyclic code of a communication system as claimed in claim 1, wherein the first element of the syndrome vector Si is $$S_1 = e_0 w^{k(N-1)} + e_1 w^{k(N-2)} + \ldots + e_{N-2} w^{k1} + e_{N-1}$$

and the second element of the syndrome vector is:

$$S_2 = e_0 w^{(k+1)(N-1)} + e_1 w^{(k+1)(N-2)} + \ldots + e_{N-2} w^{(k+1)1} + e_{N-1}$$

wherein $r_i$ is the value in ith register; and $w_N = e^{-jw_0} = e^{-j2\pi/N}$.

3. The cyclic step by step decoding method used in a discrete Fourier transform cyclic code of a communication system as claimed in claim 1, wherein the communication system is a wired communication system.

4. The cyclic step by step decoding method used in a discrete Fourier transform cyclic code of a communication system as claimed in claim 1, wherein the communication system is a wireless communication system.

5. The cyclic step by step decoding method used in a discrete Fourier transform cyclic code of a communication system as claimed in claim 1, wherein the discrete signal is an analog discrete signal.

6. The cyclic step by step decoding method used in a discrete Fourier transform cyclic code of a communication system as claimed in claim 1, wherein the discrete signal is a digital discrete signal.

7. The cyclic step by step decoding method used in a discrete Fourier transform cyclic code of a communication system as claimed in claim 1, wherein when the symbol has only one word, the circuit structure is constructed by the following components:

a subtractor with inputs of the first and second elements of the syndrome vector for performing a subtracting operation;

a first comparator with an input from an output of the subtractor and the threshold;

a second comparator with an input of the first element of the syndrome vector and the threshold;

an AND gate having an input end connected to the outputs of the first and second comparators;

a first gate enabled by an output of the AND gate and having an input end connected to the first element of the syndrome vector;

a second gate enabled by an output of the second comparator and having an input of 0;

a first OR gate connected to an output of the second comparator and an output of the AND gate; and a second OR gate connected to outputs of the first and second amplifiers.

8. The cyclic step by step decoding method used in a discrete Fourier transform cyclic code of a communication system as claimed in claim 1, wherein each of the N stages buffer registers has m parallel connected flip flops; wherein m is equal to 8, 16 or 32 and is determined according to a resolution; the N buffer registers serving to store received signals and check and correct the signals in a symbol-by-symbol way.

9. A cyclic step by step decoding device used in a discrete Fourier transform cyclic code of a communication system, wherein in the transmitting terminal, signals are encoded by DFT (discrete Fourier transform) and then are emitted; a receiving system then receives discrete signals each having N symbols, and the N symbol discrete signal is decoded for removing errors and acquiring the original emitting signals, comprising the steps of:

a symbol receiving gate for receiving input signals;

N series connected buffer registers connected in series, each buffer register serving for registering one symbol;

a shift control gate connected between a first and an Nth buffer register for right-round-shifting the symbol in each buffer register through one register;

a syndrome vector calculating unit connected to an output of the Nth buffer register in parallel for calculating first and second elements of the syndrome vector;

a processing unit for comparing the syndrome elements in the syndrome vector; controlling operations of the signal receiving gate and the shift control gate; and a subtractor for performing an operation of subtraction on outputs of the buffer registers and the processing unit; and outputting the result;

wherein the cyclic step by step decoding device performs a cyclic step by step decoding method including the steps of receiving a discrete signal having N symbols; storing the discrete signal into N stage buffer registers; setting a number of i and an initial value of i to 0 such that (i) if i is equal to N, the receiving signal is incorrect; and the cyclic step by step decoding method comes to an end; (ii) if i is unequal to N, then the the cyclic step by step decoding method enters into the next step; calculating a first element and a second element of a syndrome vector according to the received symbols; determining whether the first element and second element of the syndrome vector are larger than a threshold; if both the first and second elements are smaller than the threshold, representing the error of N−1−i as 0; and then outputting all the symbols in the registers, which are decoded signals; the cyclic step by step decoding method coming to an end; if one of the first and second elements is larger than the threshold; subtracting the two elements, taking an absolute value of the result from the subtracting operation and comparing the absolute value to the threshold; if smaller than the threshold, taking the (N−1−i)th error as the first element of the syndrome vector; subtracting the error from the (N−1−i) symbol; and then outputting all the symbols in the registers, which are decoded signals; if larger than the threshold, then round-shifting the symbols in N registers to right by one length of one register; and thus acquiring a new register series; and adding one to the number i and returning the cyclic step by step decoding method to the step of calculating the syndrome vector and repeating the above step by step decoding method.

10. The cyclic step by step decoding device used in a discrete Fourier transform cyclic code of a communication system as claimed in claim 9, wherein the first element of the syndrome vector Si $$S_1 = e_0 w^{k(N-1)} + e_1 w^{k(N-2)} + \ldots + e_{N-2} w^{k1} + e_{N-1}$$

and the second element of the syndrome vector is:

$$S_2 = e_0 w^{(k+1)(N-1)} + e_1 w^{(k+1)(N-2)} + \ldots + e_{N-2} w^{(k+1)1} + e_{N-1}$$

wherein $r_i$ is the value in ith register; and $w_N = e^{-jw_0} = e^{-j2\pi/N}$.

11. The cyclic step by step decoding device used in a discrete Fourier transform cyclic code of a communication system as claimed in claim 9, wherein the communication system is a wired communication system.

12. The cyclic step by step decoding device used in a discrete Fourier transform cyclic code of a communication system as claimed in claim 9, wherein the communication system is a wireless communication system.

13. The cyclic step by step decoding device used in a discrete Fourier transform cyclic code of a communication system as claimed in claim 9, wherein the discrete signal is an analog discrete signal.

14. The cyclic step by step decoding device used in a discrete Fourier transform cyclic code of a communication system as claimed in claim 9, wherein the discrete signal is a digital discrete signal.

15. The cyclic step by step decoding device used in a discrete Fourier transform cyclic code of a communication system as claimed in claim 9, wherein when the symbol has only one word, the circuit structure is constructed by the following components:

a subtractor with inputs of the first and second elements of the syndrome vector for performing a subtracting operation;

a first comparator with an input from an output of the subtractor and the threshold;

a second comparator with an input of the first element of the syndrome vector and the threshold;

an AND gate having an input end connected to the outputs of the first and second comparators;

a first amplifier enabled by an output of the AND gate and having an input end connected to the first element of the syndrome vector;

a second amplifier enabled by an output of the second comparator and having an input of 0;

a first OR gate connected to an output of the second comparator and an output of the AND gate; and a second OR gate connected to outputs of the first and second amplifiers.

16. The cyclic step by step decoding device used in a discrete Fourier transform cyclic code of a communication system as claimed in claim 9, wherein each of the N stages buffer registers has m parallel connected flip flops; wherein m is equal to 8, 16 or 32 and is determined according to a resolution; the N buffer registers serving to store received signals and check and correct the signals in a symbol-by-symbol way.

17. A cyclic step by step decoding device used in a discrete Fourier transform cyclic code of a communication system, wherein in the transmitting terminal, signals are encoded by DFT (discrete Fourier transform) and then are emitted; a receiving system then receives discrete signals each having N symbols, and the N symbol discrete signal is decoded for removing errors and acquiring the original emitting signals, comprising the steps of:

a symbol receiving gate for receiving input signals;

N series connected buffer registers connected in series, each buffer register serving for registering one symbol;

a syndrome vector calculating unit connected to an output of the Nth buffer register in series for calculating first and second elements of the syndrome vector;

a control gate serially connected between the first buffer register and the signal receiving gage for controlling signals from the receiving gate and the shift control gate;

a processing unit for comparing the syndrome elements in the syndrome vector; controlling operations of the signal receiving gate and the control gate; and a subtractor for performing an operation of subtraction on outputs of the buffer registers and the processing unit; and outputting the result;

wherein the cyclic step by step decoding device performs a cyclic step by step decoding method including the steps of receiving a discrete signal having N symbols; storing the discrete signal into N stage buffer registers; setting a number of i and an initial value of i to 0 such that (i) if i is equal to N, the receiving signal is incorrect; and the cyclic step by step decoding method comes to an end; (ii) if i is unequal to N, then the cyclic step by step decoding method enters into the next step; calculating a first element or a second element of a syndrome vector according to the received symbols; determining whether the first element and second element of the syndrome vector are larger than a threshold; if both the first and second elements are smaller than the threshold, representing the error of N−1−i as 0; and then outputting all the symbols in the registers, which are decoded signals; the cyclic step by step decoding method coming to an end; if one of the first and second elements is larger than the threshold; subtracting the two elements, taking an absolute value of the result from the subtracting operation and comparing the absolute value to the threshold; if smaller than the threshold, taking the (N−1−i)th error as the first element of the syndrome vector; subtracting the error from the (N−1−i) symbol; and then outputting all the symbols in the registers, which are decoded signals; if larger than the threshold, then round-shifting the symbols in N registers to right by one length of one register; and thus acquiring a new register series; and adding one to the number i and returning the cyclic step by step decoding method to the step of calculating the syndrome vector and repeating the above step by step decoding method.

18. The cyclic step by step decoding device used in a discrete Fourier transform cyclic code of a communication system as claimed in claim 17, wherein the first element of the syndrome vector Si $$S_1 = e_0 w^{k(N-1)} + e_1 w^{k(N-2)} + \ldots + e_{N-2} w^{k1} + e_{N-1}$$

and the second element of the syndrome vector is:

$$S_2 = e_0 w^{(k+1)(N-1)} + e_1 w^{(k+1)(N-2)} + \ldots + e_{N-2} w^{(k+1)1} + e_{N-1}$$

wherein $r_i$ is the value in ith register; and $w_N = e^{-jw_0} = e^{-j2\pi l/N}$.

19. The cyclic step by step decoding device used in a discrete Fourier transform cyclic code of a communication system as claimed in claim 17, wherein the communication system is a wired communication system.

20. The cyclic step by step decoding device used in a discrete Fourier transform cyclic code of a communication system as claimed in claim 17, wherein the communication system is a wireless communication system.

21. The cyclic step by step decoding device used in a discrete Fourier transform cyclic code of a communication system as claimed in claim 17, wherein the discrete signal is an analog discrete signal.

22. The cyclic step by step decoding device used in a discrete Fourier transform cyclic code of a communication system as claimed in claim 17, wherein the discrete signal is a digital discrete signal.

23. The cyclic step by step decoding device used in a discrete Fourier transform cyclic code of a communication system as claimed in claim 17, wherein when the symbol has only one word, the circuit structure is constructed by the following components:

a subtractor with inputs of the first and second elements of the syndrome vector for performing a subtracting operation;

a first comparator with an input from an output of the subtractor and the threshold;

a second comparator with an input of the first element of the syndrome vector and the threshold;

an AND gate having an input end connected to the outputs of the first and second comparators;

a first amplifier enabled by an output of the AND gate and having an input end connected to the first element of the syndrome vector;

a second amplifier enabled by an output of the second comparator and having an input of 0;

a first OR gate connected to an output of the second comparator and an output of the AND gate; and a second OR gate connected to outputs of the first and second amplifiers.

24. The cyclic step by step decoding device used in a discrete Fourier transform cyclic code of a communication system as claimed in claim 17, wherein each of the N stages buffer registers has m parallel connected flip flops; wherein m is equal to 8, 16 or 32 and is determined according to a resolution; the N buffer registers serving to store received signals and check and correct the signals in a symbol-by-symbol way.

* * * * *